(12) United States Patent
Humphrey et al.

(10) Patent No.: US 6,777,755 B2
(45) Date of Patent: Aug. 17, 2004

(54) METHOD AND APPARATUS FOR CREATING A RELIABLE LONG RC TIME CONSTANT

(75) Inventors: Guy Harlan Humphrey, Fort Collins, CO (US); Richard A Krzyzlowski, Ft. Collins, CO (US); C. Stephen Dondale, Ft. Collins, CO (US); Jason Gonzalez, Ft Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 215 days.

(21) Appl. No.: 10/008,123

(22) Filed: Dec. 5, 2001

(65) Prior Publication Data

US 2003/0102813 A1 Jun. 5, 2003

(51) Int. Cl.[7] .......................... H01L 23/62; H01L 29/00
(52) U.S. Cl. ...................... 257/360; 257/363; 257/357; 257/358; 257/533; 257/537
(58) Field of Search ................... 257/173, 174, 257/359, 360, 363, 355, 356, 357, 358, 533, 532, 537; 361/56, 11

(56) References Cited

U.S. PATENT DOCUMENTS 5,535,086 A * 7/1996 Mentzer ...................... 361/56
5,789,694 A * 8/1998 Mey ............................ 86/20.15
6,046,894 A * 4/2000 Ida ............................. 713/500
2003/0058061 A1 * 3/2003 Shih et al. ................. 333/99 S

* cited by examiner

Primary Examiner—Minhloan Tran
Assistant Examiner—Tan Tran

(57) ABSTRACT

An electrostatic discharge (ESD) structure for use in an integrated circuit (IC). The ESD structure comprises a metallic resistor and a metallic capacitor that are electrically coupled in series to form a resistor-capacitor (RC) component having an appropriate RC time constant. The RC component maintains a level of charge between ground and a shunt node to ensure that, during an ESD event, electrostatic charge on a power supply, VDD, associated with the ESD structure is shunted via a shunt path from said power supply VDD to said ground. By using metal to create the metal resistor and capacitor, charge leakage problems that result from parasitic capacitance associated with using an RC component comprised of either a poly, active, or nwell resistor in combination a diode are eliminated. By eliminating such charge leakage problems, a more reliable RC component, and thus a more reliable RC time constant, are obtained.

15 Claims, 4 Drawing Sheets

METHOD AND APPARATUS FOR CREATING A RELIABLE LONG RC TIME CONSTANT

TECHNICAL FIELD OF THE INVENTION

The present invention generally relates to integrated circuits (ICs) and, more particularly, to a method and apparatus for creating a reliable long resistor/capacitor (RC) time constant in order to reduce the possibility of electrostatic discharge (ESD) core shunts being turned on in the IC when they shouldn't be.

BACKGROUND OF THE INVENTION

One well known use for creating long RC time constants is in ESD structures, which are used to shunt static electricity from power supplies (VDD) in an IC to ground. As is commonly known in the art, static electricity can build up on VDD nodes within an IC due to various causes, such as when a person handling the IC touches a pin of the IC. This is one type of ESD event that causes a VDD node to begin charging up, and this charge needs to be shunted to ground to prevent damage to the IC. The manner in which an ESD event is commonly handled can be seen in FIG. 1.

FIG. 1 illustrates a schematic diagram of a typical ESD structure 1. During an ESD event, the VDD node 2 begins being charged and the power supply begins to rise. The SHUNTN signal remains constant due to the high RC time constant of the resistor 3/capacitor 4 combination. When VDD rises to a high enough level, it will begin to turn on the PFET, p1, labeled with the numeral 5. This, in turn, will charge up the gate node 6, which will turn on a relatively large NFET, n2, labeled with the numeral 7. The NFET n2 7 is designed to shunt large amounts of current between VDD and ground, GND. This provides an ESD path from VDD to GND during an ESD event, thereby preventing elements in the IC from being damaged due to high voltages caused by the build up of electrostatic charges.

In current ESD structure designs, it is known to use either a poly, active, or nwell resistor in combination with a diode to create the RC combination represented by the resistor 3/capacitor 4 combination shown in FIG. 1. The problem with such an ESD structure is that, because of the large RC time constant needed (e.g., >300 nanoseconds (ns)), this design may allow charge to leak off of the SHUNTN node 8. The charge on the SHUNTN node needs to remain relatively stable to ensure that the RC time constant is longer than an ESD event. Otherwise, the ESD structure will not operate properly, i.e., the gate node 6 will not charge up and turn on NFET n2 7, and the charge on VDD will not be shunted from VDD through NFET n2 7 to GND.

Accordingly, a need exists for an ESD structure with a reliable long RC time constant. By ensuring that the RC time constant is reliable, any potential damage to elements of the IC due to high voltage levels caused by electrostatic charge build up can be prevented.

SUMMARY OF THE INVENTION

In accordance with the present invention, an electrostatic discharge (ESD) structure is provided for use in an integrated circuit (IC). The ESD structure comprises a metallic resistor and a metallic capacitor that are electrically coupled in series to form a resistor-capacitor (RC) component having an appropriate RC time constant. The RC component maintains a level of charge between the shunt node and ground to ensure that, during an ESD event, electrostatic charge on the power supply VDD is shunted via a shunt path from said power supply VDD to said ground. By using metal to create the metal resistor and capacitor, charge leakage problems due to parasitic capacitance associated with an RC component comprised of either a poly, active, or nwell resistor in combination with a diode are eliminated. The problem with such an ESD structure is that, because of the large RC time constant needed, this design may allow charge to leak off of the SHUNTN node. By using metal to create the metal resistor and capacitor, such charge leakage problems caused by parasitic capacitance are eliminated, which results in a more reliable RC component and thus a more reliable RC time constant.

These and other features and advantages of the present invention will become apparent from the following description, drawings and claims.

DETAILED DESCRIPTION OF THE INVENTION

Figure 2:
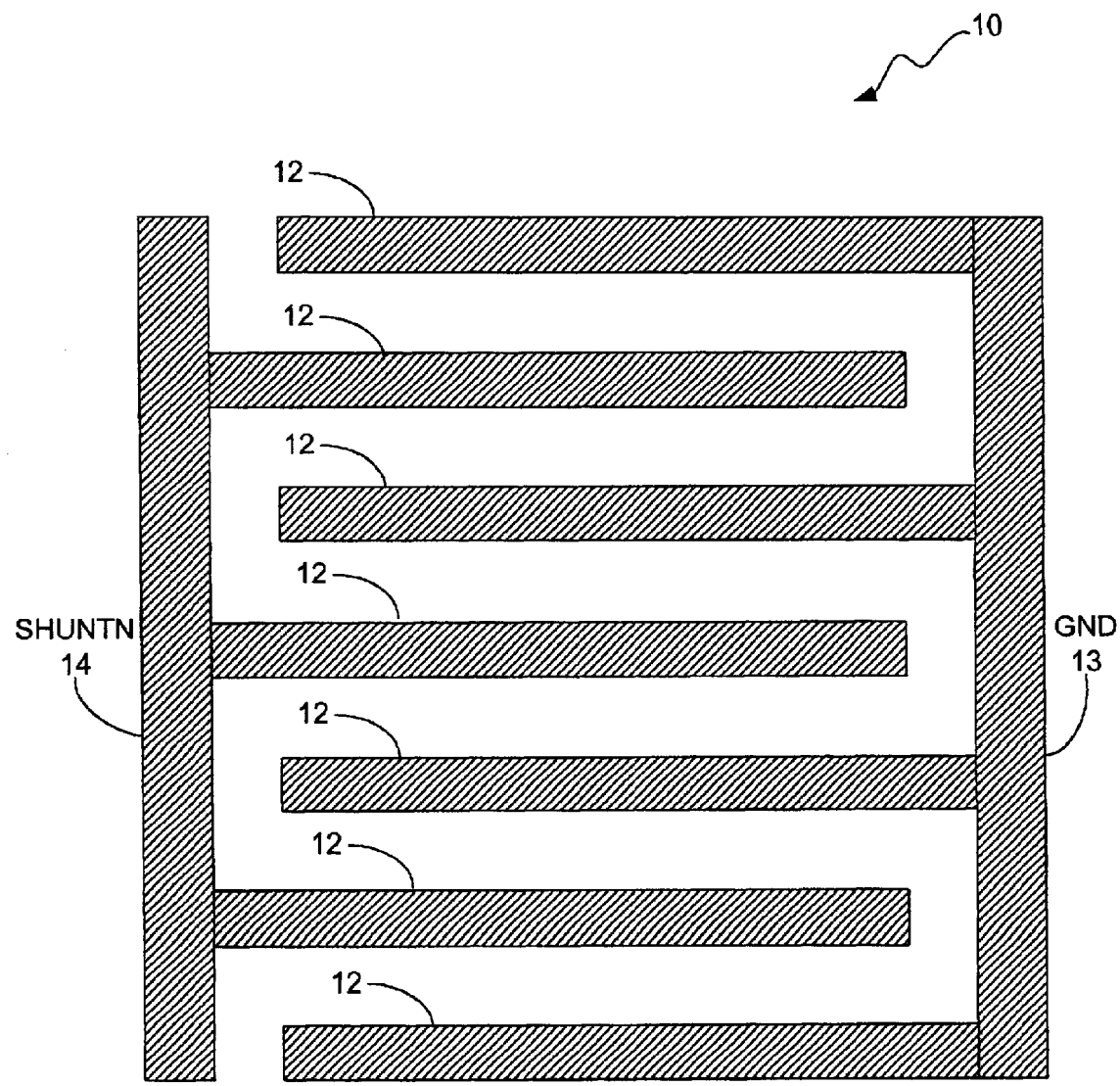
FIG. 2 is a top view of an example embodiment of the capacitor of the ESD structure of the present invention.

In accordance with the present invention, the capacitor used for the ESD structure is capacitance created by placing metallic lines on the IC that have relatively high side walls in a pattern such as that shown in FIG. 2. The resistor used for the ESD structure is via resistance of metallic interconnected structures formed on the IC that have a design such as that shown in FIG. 3. By using metallic capacitance and resistance, and by removing coupling to the silicon, charge leakage problems of the RC component caused by, for example, parasitic capacitance devices such as diodes, are obviated.

Although metal is of relatively low resistance, via resistance is relatively large. Therefore, by connecting many of the structures shown in FIG. 3 in series, a sufficiently high resistance can be obtained to generate the necessary RC time constant of the ESD structure, as discussed in detail below with reference to FIG. 4. With respect to the metal capacitor shown in FIG. 2, the metal height of the walls is larger than the metal spacing of the walls, which creates a lot of capacitance between neighboring side walls. This feature of the present invention also takes advantage of improvements in IC process technologies.

As IC processes become increasingly capable of scaling down component sizes, the ratio of the heights of the metal lines to the minimum widths of the metal lines has increased. This is intentionally done in current IC processes to prevent metal signal lines from having too much resistance.

Also, with current IC processing technologies the heights of the metal lines compared to the space between the metal side walls of the metal lines is approximately 2-to-1 in units. Thus, the capacitance attributed to the spacing between neighboring metallic side walls of the metal lines can be very large. Furthermore, by placing metal layers one atop of the other, such as by placing one of the structures shown in FIG. 2 a small distance above or below another of the same structures, additional capacitance can be created.

FIG. 2 illustrates one of the metal capacitor structures 10 of the present invention in accordance with an example embodiment. The structure 10 is comprised of interleaved metal lines 12, some of which are connected to ground, GND 13, and some of which are connected to SHUNTN 14. The drawing of the structure 10 is not to scale and therefore does not precisely show the aforementioned width-to-height ratios of the metal lines 12 or the spacing between the metal lines 12, both of which contribute to the capacitance of the structure 10. Also, because FIG. 2 is a top view, these physical features are not illustrated.

As stated above, one or more structures such as the structure 10 shown in FIG. 2 can be placed one atop of the other with a spacing in between them to create additional capacitance. Also, the structure 10 is, in reality, only a portion of what the actual metal capacitor would look like in an IC. The actual structure would have a large number of extremely thin metal lines with extremely small spacings in between them. The width-to-height ratios of the lines and their lengths are not limited to any particular dimensions and are scalable in accordance with the IC process used to fabricate the IC. Therefore, these dimensions are subject to change depending on the IC fabrication process used to create the IC, regardless of whether the process is one currently being used or one developed or modified in the future.

Figure 1:
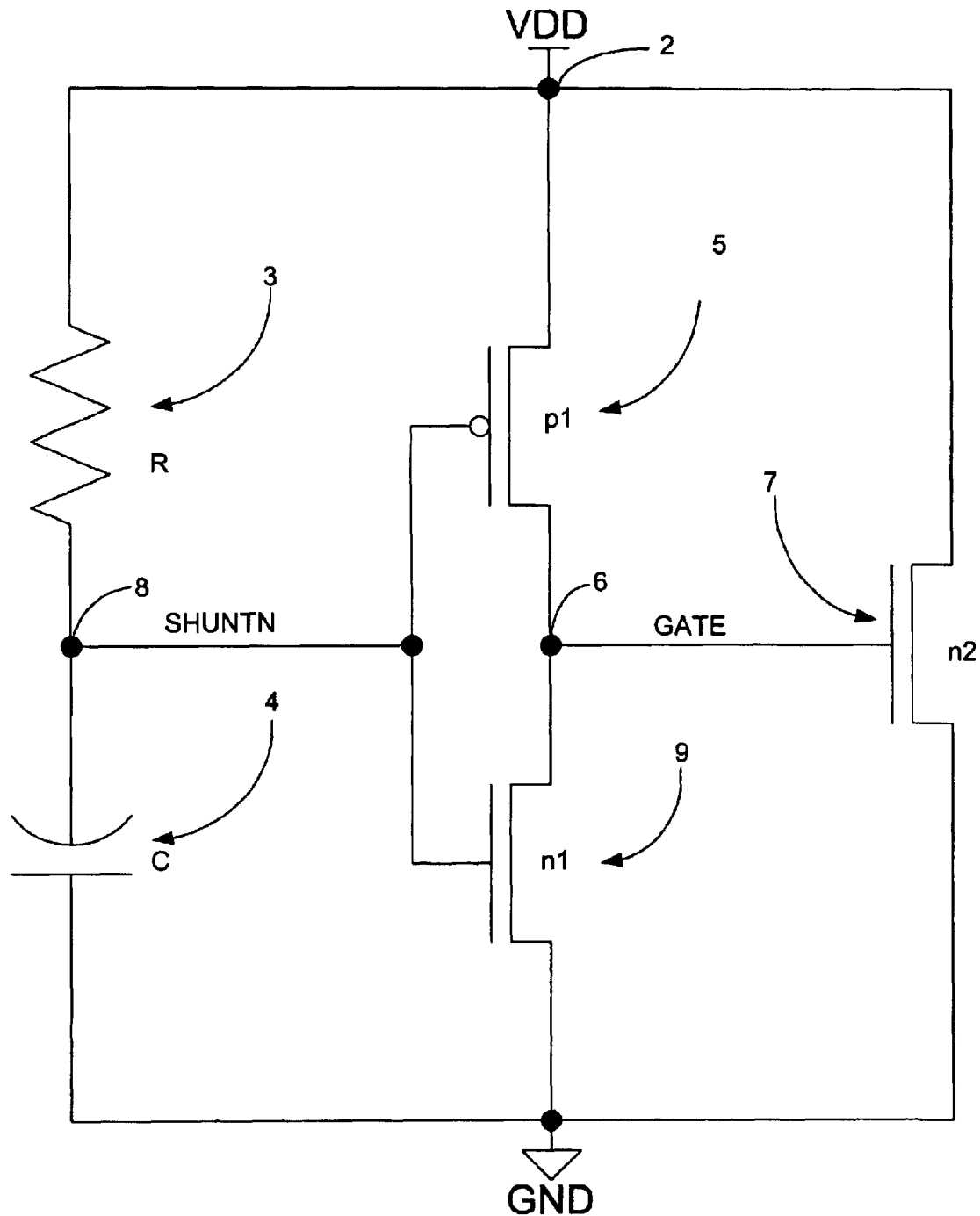
FIG. 1 is a schematic diagram of an ESD structure of an IC.
Figure 3:
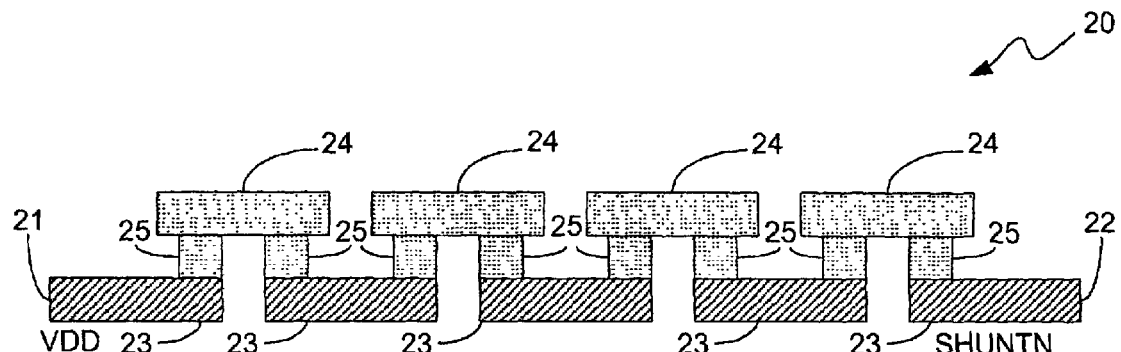
FIG. 3 is a side view of an example embodiment of the metal resistor of ESD structure of the present invention.

FIG. 3 is a side view of an example embodiment of the metal resistor 20 of the present invention connected on one end 21 to the VDD node (FIG. 1, labeled 2) and on the opposite end 22 to the SHUNTN node (FIG. 1, labeled 8). The metal resistor 20 is comprised of lower metal portions 23 and upper metal portions 24 that are connected together by metal vias 25. Although the lower and upper metal portions 23 and 24 are not extremely high in resistance, the metal vias 25 provide very high resistance.

Figure 4:
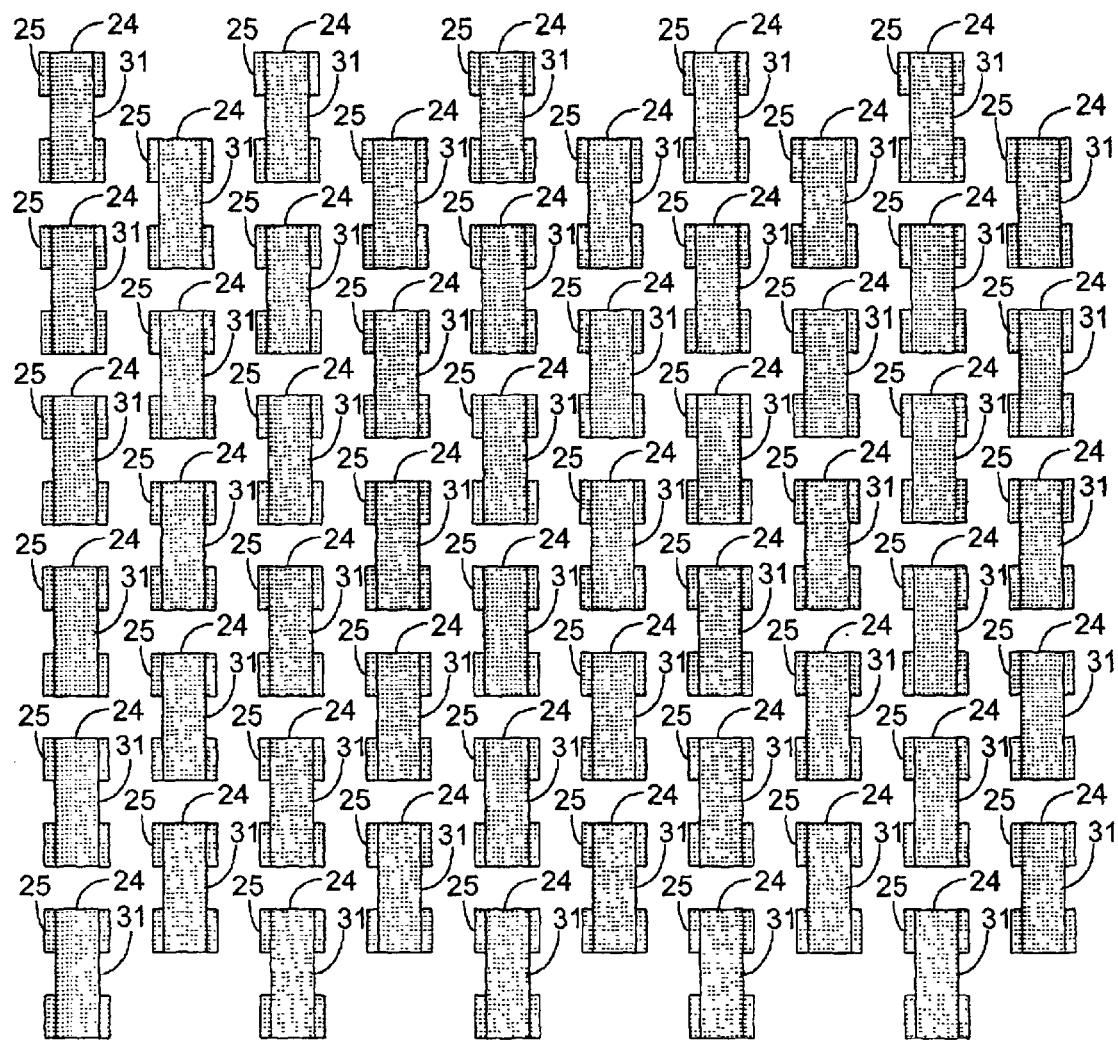
FIG. 4 is a top view of the metal resistor structure shown in FIG. 3 without the lower metal portion.

FIG. 4 is a top view of the metal resistor structure 20 shown in FIG. 3 without the lower metal portions 23. In FIG. 4, the lower metal portion is not shown in order to enable the arrangement of the structures 24 of the metal resistor in accordance with the example embodiment to be clearly illustrated. The structures 24 are arranged in a staggered configuration as shown. The interconnections between the individual resistive structures 24 are shown in FIG. 5.

Figure 5:
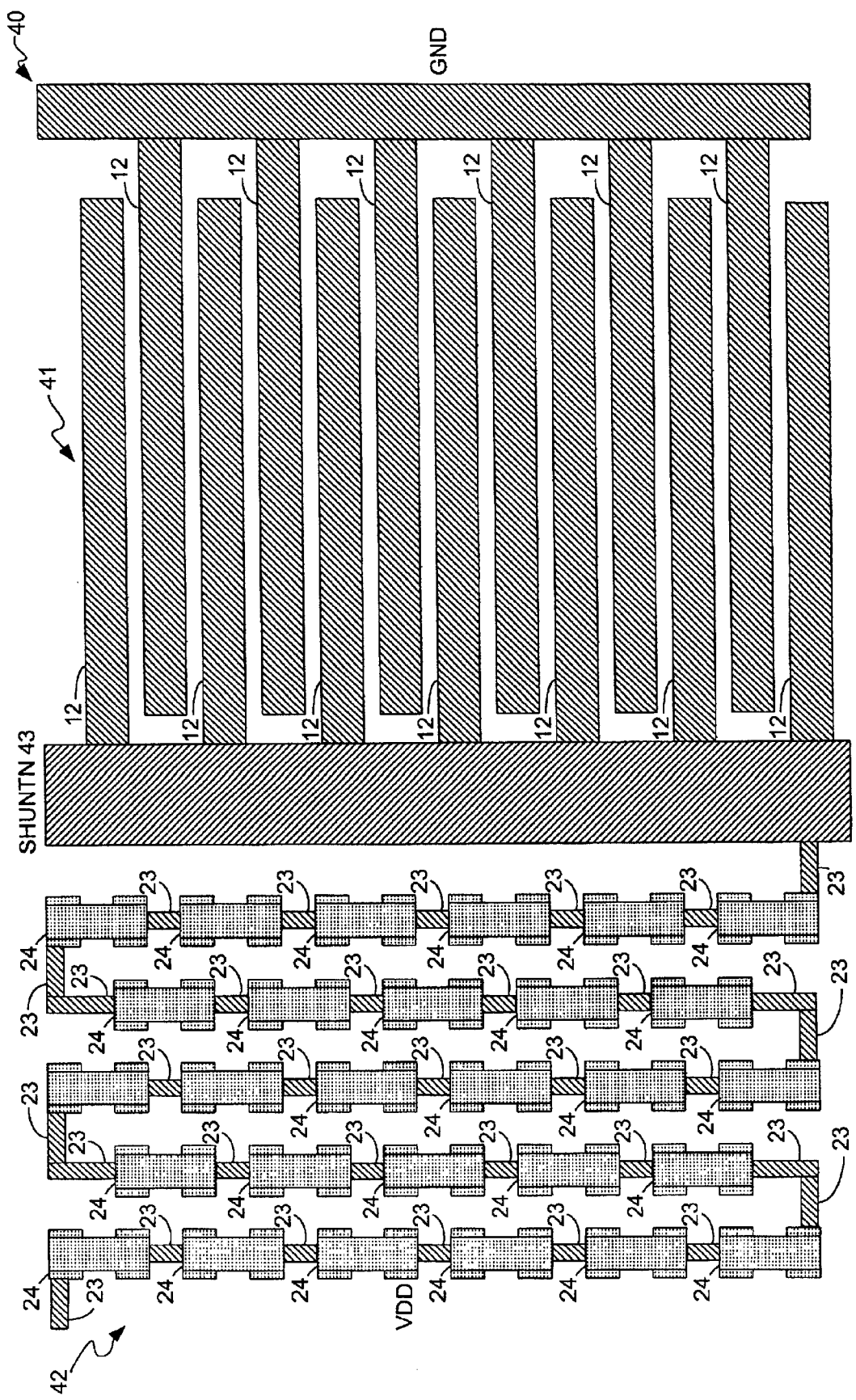
FIG. 5 is a top view of a portion of the ESD structure of the present invention that utilizes the capacitor shown in FIG. 2 and the resistor shown in FIG. 3.

FIG. 5 illustrates a top view of the EDS structure 40 of the present invention in accordance with the example embodiment, which illustrates the metal capacitor structure 41 and the metal resistor structure 42 interconnected through the SHUNTN metal line 43. In actuality, the ESD structure 40 shown in FIG. 5 represents only a small section of what the actual ESD structure would look like on an IC. The actual ESD structure would likely have many more metal lines 12 for the capacitor structure 41 and many more resistive structures 24 for the metal resistor 42.

In accordance with this example embodiment, the metal resistive structures 24 are connected in a "dog bone" configuration by the lower metal portions 23 (FIG. 3), which interconnect the vias 25 (FIGS. 3 and 4) of each resistive structure 24 to the vias 25 of the adjacent resistive structure 24. The vias 25 are shown in FIG. 5, but are not numbered due to the lack of space in FIG. 5 to label the vias 25 with numbers.

The configuration shown is being provided merely for the purposes of demonstrating one possible implementation of the metal resistor. However, it should be noted that the metal resistor of the present invention is not limited to any particular configuration, as will be understood by those skilled in the art in view of the present disclosure.

One of the vias of one of the resistive structures 24 that is furthermost from SHUNTN 43 will be connected to the VDD node (FIG. 1, labeled with numeral 2). One of the vias of a resistive structure 24 that is closer to SHUNTN 43 will be connected to SHUNTN 43. In FIG. 5, the lowest via that is closest to SHUNTN provides the conductive connection to SHUNTN.

It should be noted that the present invention is not limited to the configuration shown in FIG. 5. Those skilled in the art will understand the manner in which other ESD structure configurations can be derived from the concepts and examples provided herein. One modification that can be made to the ESD structure shown in FIG. 5 is that an additional metal resistor similar or identical to the metal resistor 42 can be placed in parallel with metal resistor 42. Doing this would provide redundancy that would further enhance the reliability of the EDS structure because if, for example, a section of the resistor 42 was damaged or simply was not created during the IC fabrication process, the additional metal resistor would still provide the resistance needed to provide a long RC time constant.

The necessary RC time constant of the ESD structure can vary without affecting the performance of the ESD structure. The only requirements on the RC time constant is that (1) it is long enough so that during an ESD event, PFET, p1, labeled with numeral 5 in FIG. 1, turns on to enable node 2 to discharge through NFET n2 to ground and (2) shorter than the normal amount of time that is required for the IC to power up so that powering up the IC does not look like an ESD event and cause the current associated with the power supply VDD to be shunted to ground through NFET n2 7. These requirements are not difficult to meet, which allows for variations in process conditions to occur without resulting in the creation of an ESD structure that is ineffective or unreliable.

The example embodiments of FIGS. 2–5 have been provided for the purpose of demonstrating the concepts and principles of the present invention, and for the purpose of demonstrating the manner in which the present invention can be implemented. Those skilled in the art will understand from the discussion provided herein that modifications can be made to the RC component described herein without deviating from the scope of the invention. Also, it should be noted that the RC component of the present invention can be used for purposes other than for an ESD structure. Those skilled in the art will understand that other modifications may be made to the embodiments discussed herein that are also within the scope of the present invention.

What is claimed is:

1. An electrostatic discharge (ESD) structure for use in an integrated circuit (IC), the ESD structure comprising:
  a metallic resistor;
  a metallic capacitor, the metallic resistor being electrically coupled in series with the metallic capacitor to form a resistor-capacitor (RC) component having an RC time constant associated therewith, the RC component maintaining a level of charge between a ground of the ESD and a shunt node of the IC to ensure that, during an ESD event, electrostatic charge on a power supply, VDD, of the IC is shunted via a shunt path from said power supply VDD to said ground, wherein the metal resistor has a resistance that results from a plurality of conductive metal elements that are connected in series, each conductive metal element being comprised of one metal layer being conductively coupled to another metal layer by metal vias.

2. The ESD structure of claim 1, wherein the metal capacitor has a capacitance that results from a relatively small spacing between metal lines formed in the IC.

3. The ESD structure of claim 2, wherein the height-to-width ratio of each of the metal lines is greater than 1.

4. The ESD structure of claim 2, wherein adjacent metal lines of the metal capacitor having a spacing between them, the spacing being less than the heights of the metal lines of the capacitor.

5. The ESD structure of claim 2, wherein the metal capacitor is separated from a like metal capacitor by a spacing, and wherein some of the capacitance of the metal capacitor results from the spacing between the metal capacitors formed on the IC.

6. The ESD structure of claim 1, wherein the metal resistor is electrically coupled in parallel to a like metal resistor formed on the IC.

7. An electrostatic discharge (ESD) structure, the ESD structure being located on an integrated circuit (IC), the ESD structure comprising:

a metallic resistor, the metal resistor having a resistance that results from a plurality of conductive metal elements that are connected in series, each conductive metal element being comprised of one metal layer being conductively coupled to another metal layer by metal vias;

a metallic capacitor, the metallic resistor being electrically coupled in series with the metallic capacitor to form a resistor-capacitor (RC) component having an RC time constant associated therewith, the metal capacitor having a capacitance that results from a relatively small spacing between metal lines formed in the IC, the RC component maintaining a level of charge between a ground of the ESD structure and a shunt node of the IC to ensure that, during an ESD event, electrostatic charge on the power supply is shunted via a shunt path from a power supply, VDD, of the IC to said ground.

8. The ESD structure of claim 7, wherein the RC time constant is greater than an ESD event but less than a period of time required for the IC to be powered up to ensure that powering up the IC does not look like an ESD event to the ESD structure.

9. The ESD structure of claim 7, wherein the height-to-width ratio of each of the metal lines is greater than 1, and wherein adjacent metal lines of the metal capacitor have a spacing between them that is smaller in width than the heights of the metal lines of the metal capacitor.

10. The ESD structure of claim 9, wherein the metal capacitor is separated from a like metal capacitor by a spacing, and wherein some of the capacitance of the metal capacitor results from the spacing between the metal capacitors.

11. The ESD structure of claim 7, wherein the metal resistor is electrically coupled in parallel to a like metal resistor formed on the IC.

12. A method for creating an electrostatic discharge (ESD) structure in an integrated circuit (IC), the method comprising the steps of:

forming a metallic resistor on an IC by forming a plurality of conductive metal elements on the IC that are connected in series, each conductive metal element being comprised of one metal layer that is conductively coupled to another metal layer by metal vias;

forming a metallic capacitor on the IC;

electrically coupling the metallic resistor and the metallic capacitor together to form a resistor-capacitor (RC) component having an RC time constant associated therewith, the RC component maintaining a level of charge between a ground of the ESD and a shunt node of the IC to ensure that, during an ESD event, electrostatic charge on a power supply, VDD, of the IC is shunted via a shunt path from said power supply VDD to said ground.

13. The method of claim 12, wherein the step of forming the metal capacitor includes the step of forming metal lines on the IC such that adjacent metal lines have a relatively small spacing between them.

14. The method of claim 13, wherein the height-to-width ratio of each of the metal lines is greater than 1.

15. The method of claim 13, wherein adjacent metal lines of the metal capacitor have a spacing between them that is smaller than the heights of the metal lines of the capacitor.

* * * * *